United States Patent
Hueting et al.

(10) Patent No.: US 6,600,194 B2
(45) Date of Patent: Jul. 29, 2003

(54) FIELD-EFFECT SEMICONDUCTOR DEVICES

(75) Inventors: Raymond J. E. Hueting, Helmond (NL); Erwin A. Hijzen, Blanden (BE); Rob Van Dalen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/803,325

(22) Filed: Mar. 9, 2001

(65) Prior Publication Data

US 2001/0020720 A1 Sep. 13, 2001

(30) Foreign Application Priority Data

Mar. 10, 2000 (GB) ............................................... 0005650

(51) Int. Cl.$^7$ .............................................. H01L 29/76
(52) U.S. Cl. ...................... 257/331; 257/330; 257/332; 257/342; 257/343
(58) Field of Search ......................... 257/302, 327–333, 257/341–344, 346; 438/259, 270, 271, 277, 588, 589

(56) References Cited

U.S. PATENT DOCUMENTS

| | | | | |
|---|---|---|---|---|
| 4,571,512 A | * | 2/1986 | Schutten et al. | 327/389 |
| 4,914,058 A | | 4/1990 | Blanchard | 437/203 |
| 5,021,845 A | * | 6/1991 | Hashimoto | 257/331 |
| 5,242,845 A | * | 9/1993 | Baba et al. | 438/259 |
| 5,504,028 A | * | 4/1996 | Wada | 438/247 |
| 5,637,898 A | * | 6/1997 | Baliga | 257/330 |
| 5,682,048 A | * | 10/1997 | Shinohara et al. | 257/342 |
| 5,973,360 A | * | 10/1999 | Tihanyi | 257/330 |
| 6,072,215 A | * | 6/2000 | Kawaji et al. | 257/334 |
| 6,140,678 A | * | 10/2000 | Grabowski et al. | 257/328 |
| 6,177,704 B1 | * | 1/2001 | Suzuki et al. | 257/343 |
| 6,184,555 B1 | * | 2/2001 | Tihanyi et al. | 257/342 |
| 6,285,060 B1 | * | 9/2001 | Korec et al. | 257/342 |
| 6,307,231 B1 | * | 10/2001 | Numazawa et al. | 257/330 |
| 6,359,308 B1 | * | 3/2002 | Hijzen et al. | 257/341 |
| 6,362,505 B1 | * | 3/2002 | Tihanyi | 257/341 |
| 2002/0038886 A1 | * | 4/2002 | Mo | 257/330 |

FOREIGN PATENT DOCUMENTS

| | | | | |
|---|---|---|---|---|
| EP | 0494597 | * | 2/1992 | 29/784 |
| JP | 63194367 | * | 8/1988 | 29/78 |
| JP | 04171764 | | 6/1992 | |
| JP | 11103056 | | 4/1999 | |

\* cited by examiner

*Primary Examiner*—Steven Loke
*Assistant Examiner*—Quang Vu
(74) *Attorney, Agent, or Firm*—Steve R. Biren

(57) ABSTRACT

A field-effect semiconductor device, for example a MOSFET of the trench-gate type, comprises side-by-side device cells at a surface (10a) of a semiconductor body (10), and at least one drain connection (41) that extends in a drain trench (40) from the body surface (10a) to an underlying drain region (14a). A channel-accommodating region (15) of the device extends laterally to the drain trench (40). The drain trench (40) extends through the thickness of the channel-accommodating region (15) to the underlying drain region (14a), and the drain connection (41) is separated from the channel-accommodating region (15) by an intermediate insulating layer (24) on side-walls of the drain trench (40). A compact cellular layout can be achieved, with a significant proportion of the total cellular layout area accommodating conduction channels (12). The configuration in a discrete device avoids a need to use a substrate conduction path and so advantageously reduces the ON resistance of the device.

8 Claims, 3 Drawing Sheets

FIELD-EFFECT SEMICONDUCTOR DEVICES

This invention relates to field-effect semiconductor devices, particularly but not exclusively insulated-gate field-effect power transistors (so-called MOSFETs) of trench-gate type, comprising side-by-side device cells at one major surface of the body, and at least one drain connection that extends in a drain trench from the one major surface to an underlying drain region. The invention also relates to methods of manufacturing such devices.

U.S. Pat. No. 5,682,048 discloses such a field-effect semiconductor device in the context of allowing a plurality of MOSFETs to be integrated in and on the same device body. Each MOSFET comprises a plurality of side-by-side device cells at one major surface of the body. The configuration of each device cell is conventional in having a source region that is separated by a channel-accommodating region of a first conductivity type from an underlying drain region of an opposite, second conductivity type. In conventional manner, a gate electrode is capacitively coupled to the channel-accommodating region to control a conduction channel between the source and drain regions. The whole contents of U.S. Pat. No. 5,682,048 are hereby incorporated herein as reference material.

In the devices of U.S. Pat. No. 5,682,048, the drain region of each MOSFET comprises an individual highly-doped buried layer between a drain drift region and the device substrate. The individual buried layers allow separate drain connections to the individual MOSFETs. Because a plurality of these MOSFETs are integrated in the same device body, each MOSFET has at least one individual drain connection between the one major surface and the drain buried layer. U.S. Pat. No. 5,682,048 discloses forming these drain connections as low resistivity material in a drain trench that extends through an area of the drain drift region, from the one major surface to the underlying drain buried layer. These trenched drain connections are of much lower resistivity than the drain drift region, and so reduce the ON resistance of the MOSFET.

It is an aim of the present invention to provide trenched drain connections in MOSFETs and similar devices, in a particularly advantageous manner that allows a more compact cellular layout. In addition, a configuration is desirable that may be used advantageously to reduce ON resistance by avoiding a substrate conduction path in discrete devices and to allow proportionally more of the total cellular layout area to accommodate conduction channels.

According to the present invention, there is provided a field-effect semiconductor device comprising a plurality of side-by-side device cells and at least one trenched drain connection, wherein the device has a channel-accommodating region that extends laterally to the drain trench, the drain trench extends through the thickness of the channel-accommodating region to the underlying drain region, and the drain connection is separated from the channel-accommodating region by an intermediate insulating layer on side-walls of the drain trench.

A compact cellular layout can be achieved, because no intermediate area of drain drift region is needed to separate the trenched drain connection from the channel-accommodating region. The invention provides a configuration of trenched drain connection that may even be used in low-voltage devices that do not have a low-doped drift region.

In a discrete device, the underlying drain region may comprise a monocrystalline substrate of the second conductivity type. The trenched drain connection to the upper surface of the body (typically an epitaxial layer) avoids the need to provide a conduction path in conventional manner through the substrate to its lower surface. As device design becomes more efficient in reducing the ON resistance, especially in trench-gate devices, this conduction path in the substrate would add noticeably (in the absence of the invention) to the total ON resistance between source and drain.

In order to accommodate conduction channels in proportionally more of the total cellular layout area, the drain trench may extend through a cell comprising an active source region. This source region can be laterally separated from the drain trench by an intermediate part of the channel-accommodating region.

In order to reduce the total cellular area occupied by the trenched drain connection(s), a drain trench or even each drain trench may extend through a connection cell that is laterally adjoined by device cells without a drain trench. These adjoining device cells may, for example, laterally surround the connection cell.

Several particularly advantageous features and options available with the invention are set out in the appended claims.

Several of the device structures can also be manufactured advantageously in accordance with the invention. Thus, for example, etching the drain trench through the thickness of the channel-accommodating region localises the layout of the channel-accommodating region at the major surface of the body. The channel-accommodating region may be formed from a continuous doped layer of the first conductivity type at this major surface. Thus, for example, it may be formed from a non-localised (blanket) dopant implantation and/or diffusion in at least the active area of the device, or a doped epitaxial layer. When the device is of the trench-gate type, the gate trench may be etched in the same process steps as the drain trench. Both trenches may even be of the same depth.

These and other features of the present invention are illustrated in embodiments now described, by way of example, with reference to the accompanying diagrammatic drawings, in which.

Figure 1:
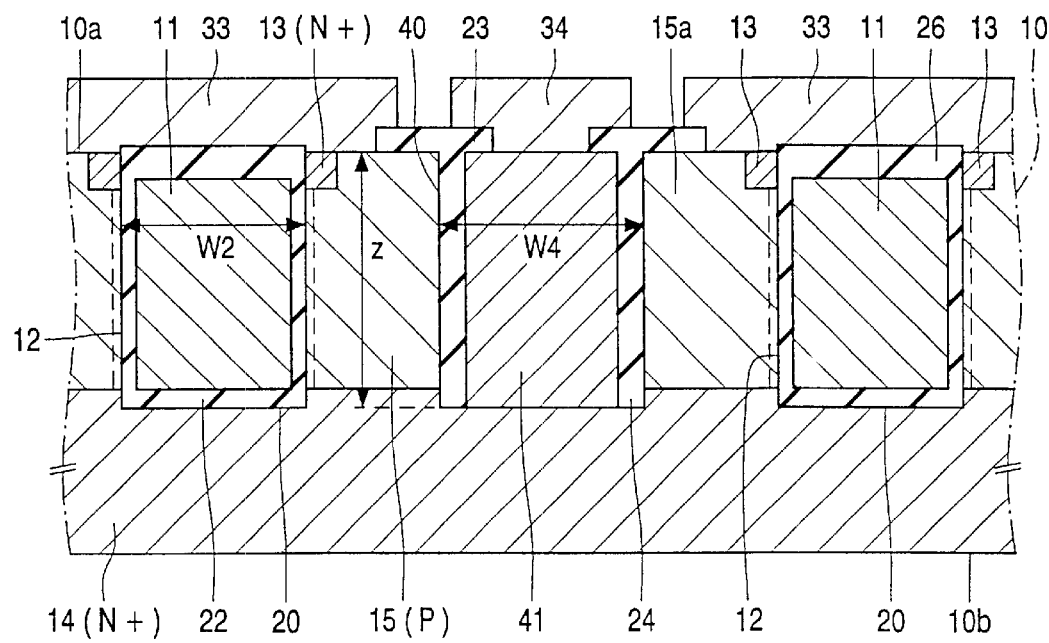
FIG. 1 is a cross-sectional view of an active central part of a simple, low-voltage, trench-gate field-effect semiconductor device in accordance with the invention.
Figure 2:
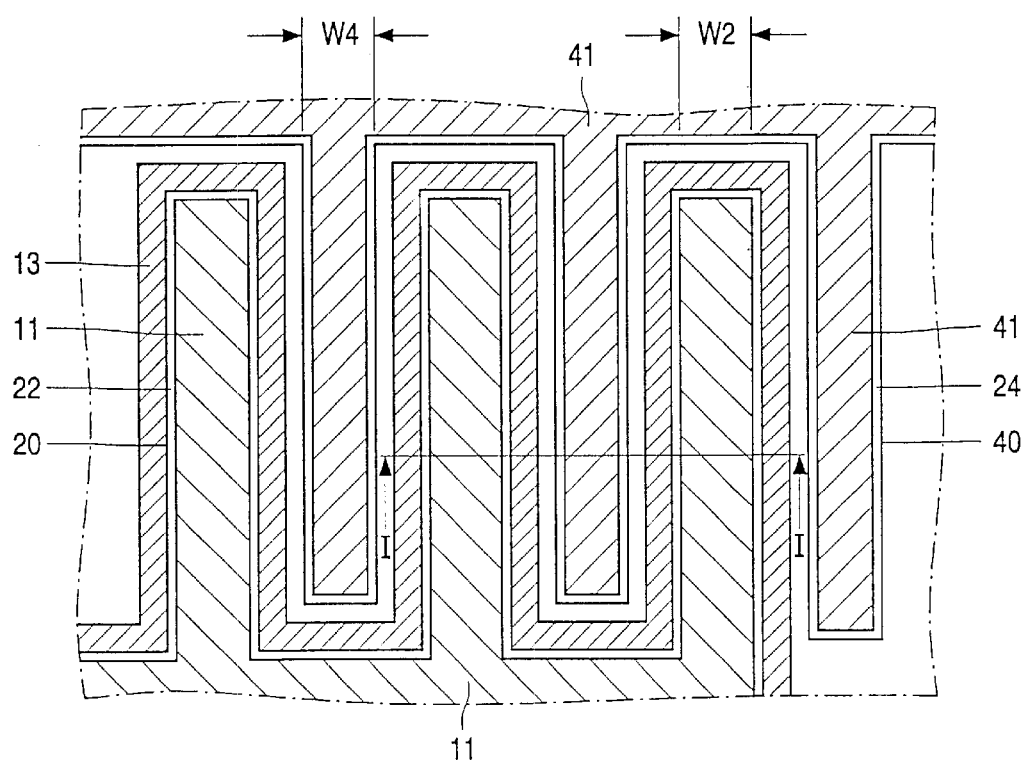
FIG. 2 is a diagrammatic plan view of part of an interdigital layout of a trench-gate field-effect semiconductor device in accordance with the invention, such as the device of FIG. 1 or the device of FIG. 4.
Figure 3:
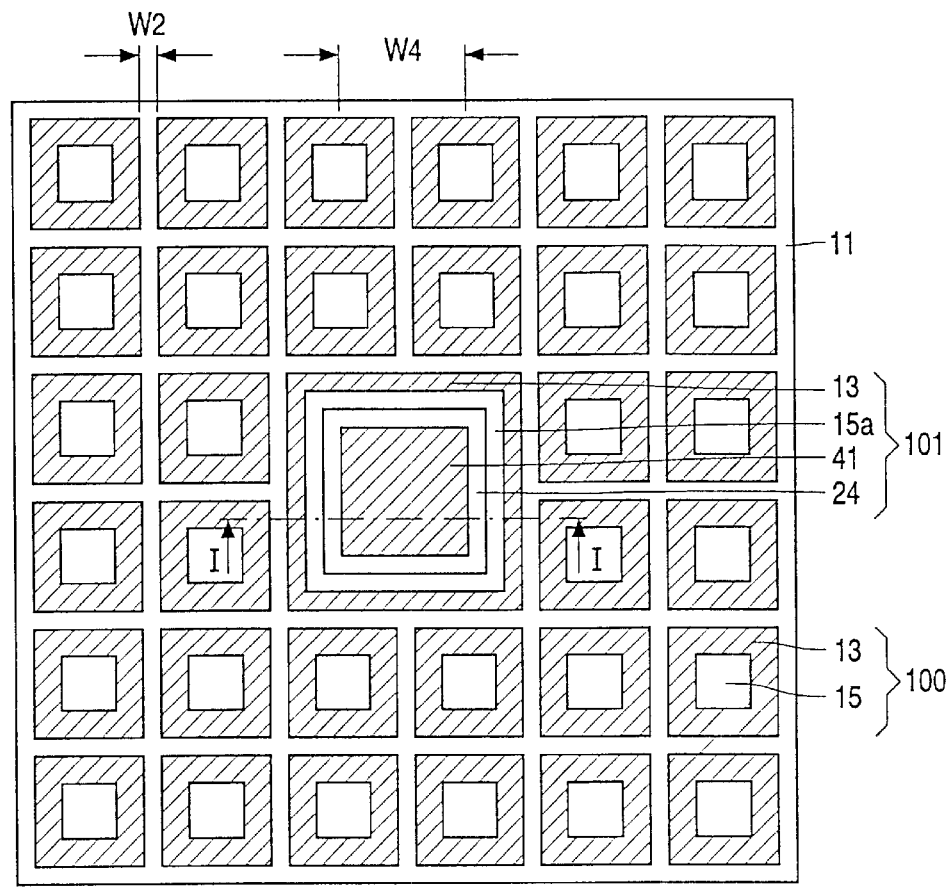
FIG. 3 is a diagrammatic plan view of part of an alternative layout of a trench-gate field-effect semiconductor device in accordance with the invention, such as the device of FIG. 1 or the device of FIG. 4.
Figure 4:
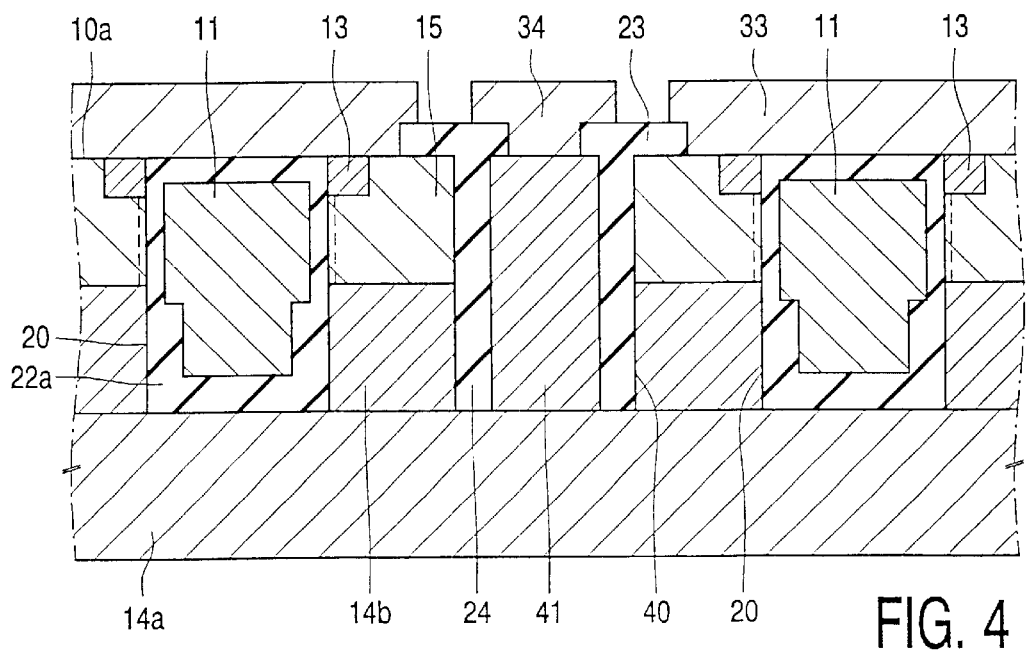
FIG. 4 is a cross-sectional view of an active central part of another trench-gate field-effect semiconductor device in accordance with the invention, as a modification of FIG. 1 for operation at higher voltages.

The lines I—I in FIGS. 2 and 3 indicate sectional lines where the cross-sections of FIGS. 1 and 4 can be taken. It should be noted that all the Figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

FIG. 1 illustrates an exemplary embodiment of a cellular power semiconductor device in the form of a trench-gate MOSFET. In the transistor cell areas of this device, a channel-accommodating region 15 of a first conductivity type (p-type in this example) separates source and drain regions 13 and 14, respectively, of an opposite second conductivity type (n-type in this example). The gate electrode 11 is present in a trench 20 that extends through the regions 13 and 15 into an underlying portion of the drain region 14. This gate trench 20 is lined with a gate dielectric 22 via which the gate electrode 11 is capacitively coupled to the channel-accommodating region 15. Thus, the application of a voltage signal to the gate electrode 11 in the on-state of the device serves in known manner for inducing a conduction channel 12 (of electrons in this example) in the region 15 and for controlling current flow in this conduction channel 12 between the source and drain regions 13 and 14. The source region 13 is located adjacent to the top major surface 10a of the device body, where it is contacted by a source electrode 33. The device has its drain electrode 34 also at the top surface 10a of the device body.

The present invention provides an advantageous way of forming at least one connection 41 between the drain electrode 34 and the drain region 14. The drain connection 41 extends in a drain trench 40 from the surface 10a to the underlying drain region 14. The drain trench 40 is etched through the thickness of the channel-accommodating region 15 to the underlying drain region 14. As a result, the channel-accommodating region 15 extends laterally to the drain trench 40. The drain connection 41 is separated from the channel-accommodating region 15 by an intermediate insulating layer 24 on the side-walls of the drain trench 40. The device cell though which the drain trench 40 extends is preferably an active cell, as in the example of FIG. 1. Thus, as illustrated in FIG. 1, the drain trench 40 extends through a cell comprising a source region 13 adjacent to the gate trench 20. This source region 13 is laterally separated from the drain trench 40 by an intermediate part 15a of the channel-accommodating region 15. Due to its location, this intermediate part 15a is outside the control of the gate electrode 11.

The device of FIG. 1 is a discrete field-effect transistor in which the drain region 14 is a monocrystalline substrate of the second conductivity type (n-type). The bottom surface of this substrate (region 14) forms the back surface 10b of the device body 10, by which the device body 10 is mounted on, for example, a lead-frame platform of the device. In this device, the channel-accommodating region 15 is present in an epitaxial layer on the monocrystalline substrate (region 14).

The device of FIG. 1 is designed for operation with low voltages (for example, with up to 20 volts or 30 volts between the source and drain electrodes 33 and 34) and has no low-doped drain drift region. In this case, the channel-accommodating region 15 can be formed simply by an epitaxial layer of the first conductivity type (p-type in this example) deposited directly on the monocrystalline substrate 14. The epitaxial layer provides the channel-accommodating region 15 with its conductivity-type-determining dopant concentration (P) of the first conductivity type that is lower than the dopant concentration (N+) of the second conductivity type of the substrate, i.e. drain region 14.

Both the gate trench 20 and the drain trench 40 are etched through the thickness of the epitaxial layer (region 15) into the substrate (region 14). Both trenches 20 and 40 may be formed in the same photolithographic and etching steps, so facilitating their relative alignment in the device layout. Both trenches 20 and 40 may be of the same depth z.

The composition and thickness of the gate dielectric 22 provided in the gate trench 20 are chosen in accordance with desired gating characteristics, i.e. capacitive coupling between the gate electrode 11 and the channel-accommodating region 15. The composition and thickness of the drain insulator 24 provided in the drain trench 40 are chosen to provide the necessary insulation at the operating voltages and to reduce the capacitance between the drain connection 41 and the channel-accommodating region 15. Typically this results in the gate dielectric layer 22 being thinner (at least adjacent to the channel-accommodating region 15) than is the drain insulating layer 24. It is convenient to form both layers 22 and 24 of silicon dioxide by oxidation of the trenches. The bottom of the drain trench 40 can be re-exposed by directional etching, while masking the gate trench 20.

Typically the device body 10 is of monocrystalline silicon, and the layers 22 and 24 are of silicon dioxide. The gate electrode 11 is typically of conductively-doped polycrystalline silicon. The drain connection 41 may also be of conductively-doped polycrystalline silicon, because its depth is small. However, it can be advantageous to form the drain connection 41 of a higher conductivity material, for example a metal such as aluminium or copper or tungsten, especially if the width w4 of the drain trench 40 is reduced. The source and drain electrodes 33 and 34 may be of, for example, aluminium or copper. The source and drain electrodes 33 and 34 may be of the same metal or of different metals. Thus, for example, in a cellular layout where it is desired for a drain electrode 34 to extend on an insulating layer over the source electrode 33, then one electrode may be of copper and the other electrode may be of aluminium. A gate connection pad (contacting the gate electrode 11) may also be of aluminium or copper. An insulating layer 23 typically of silicon dioxide is present on the body surface 10a and includes windows through which the source and drain electrodes 33 and 34 contact respectively the region 13 and connection 41 and the gate connection pad contacts the electrode 11. An insulating overlayer 26 typically of silicon dioxide is present on the gate trench 20 to insulate the gate electrode 11 from the over-lying source electrode 13.

In a typical embodiment, the doping concentration (P) of the channel-accommodating portion 15 may be, for example, $10^{16}$ to $10^{17}$ boron atoms $cm^{-3}$, with an increased dopant concentration (P+) of, for example, $10^{18}$ to $10^{19}$ boron atoms $cm^{-3}$, at the surface 10a where it is contacted by the source electrode 33. The conductivity-determining dopant concentration (N+) of the source and drain regions 13 and 14 may be, for example, $10^{19}$ to $10^{22}$ phosphorus or arsenic atoms $cm^{-3}$.

The depth z of the trenches 20 and 40 may be, for example, 1 $\mu$m to 3 $\mu$m (micrometers). The gate dielectric 22 is typically less than 75 nm (nanometers) thick, for example about 50 nm thick. For a 20 volt or 30 volt device, the drain trench insulator 24 may be, for example 60 nm thick. The widths w2 and w4 of the trenches 20 and 40 and their spacing depend, inter alia, on the process technology and the cellular array geometry used for the device.

The drain trench configuration in accordance with the present invention may be incorporated in quite different, known cell geometries. Thus, for example the device cells may have a square geometry, or a close-packed hexagonal geometry, or an elongate stripe geometry. FIG. 2 illustrates an embodiment with an interdigitated stripe geometry, whereas FIG. 3 illustrates an embodiment with a square cell geometry. Only a few of the side-by side device cells are shown in the Figures, but typically the device may comprise many thousands of these parallel cells between the electrodes 33 and 34. The active cellular area of the device may be bounded around the periphery of the body 10 by various known peripheral termination schemes (not shown in the Figures). The precise form of these termination schemes depend on the process technology used for the device and the voltage characteristics of the device. Such schemes normally include the formation of a thick field-oxide layer at the peripheral area of the body surface 10a, before the transistor cell fabrication steps.

In the device of FIG. 2, the drain trench 40 and the gate electrode 11 are interdigitated in their layout. In this layout geometry, the source and drain electrodes 13 and 14 of FIG. 1 are also accordingly interdigitated. An overall large connection area between the drain electrode 34 and the underlying drain region 14 can be readily achieved when each drain trench 40 alternates with a gate trench 20. In this situation, the width w4 of the drain trench 40 can be made less than the width w2 of the gate trench 20, and a well distributed low-ohmic connection between the drain electrode 34 and the drain region 14 can still be obtained.

FIG. 3 illustrates an embodiment in which the drain trench 40 extends through a connection cell 101 that is laterally surrounded by device cells 100 without a drain trench 40. In this situation, the width w4 of the drain trench 40 is preferably larger than the width w2 of the gate trench 20, so as to reduce the resistance of the drain connection. The extra width may be accommodated by making the connection cell 101 larger than the other cells 100. In the specific example of FIG. 3, one connection cell 101 replaces four ordinary cells 100 of the array. By way of a specific example, FIG. 3 illustrates a square geometry for the cells 100 and 101.

Although FIG. 3 shows only one connection cell 101, the device may comprise a plurality of such connection cells 101 distributed among the other cells 100 of the device. Thus, for example, the cellular array of FIG. 3 may be repeated in both X and Y directions. Each connection cell 101 may be surrounded by two or more rows of cells 100 (i.e. by at least 32 cells 100 in the FIG. 3 square-cell configuration), or by a single row (i.e. by 12 cells 100 in the FIG. 3 square-cell configuration).

The connection cell 101 is also an active cell of the device in that it comprises a source region 13 adjacent to the gate trench 20. This source region 13 is laterally separated from the drain trench 40 by an intermediate part 15a of the channel-accommodating region 15. The part 15a is outside the control of the gate electrode 11.

The drain region 14 of the device of FIG. 1 has a dopant concentration N+ that is, adjacent to the channel-accommodating region 15, higher than the conductivity-type-determining dopant concentration P of the channel-accommodating region 15. FIG. 4 illustrates a different situation, in which a low-doped drain drift region 14b is adjacent to the channel-accommodating region 15. Higher voltage devices can be formed by incorporating such a drift region 14b, for example with 50 volts or more applied to the drain electrode 14.

In the device of FIG. 4, the drain region 14 comprises a highly doped electrode region 14a underlying a less highly doped drift region 14b. Typically, the drain drift region 14b has a dopant concentration (N−) of the second conductivity type that is less than the conductivity-type-determining dopant concentration (P) of the first conductivity type of the channel-accommodating region 15. The drift region 14b is typically an epitaxial layer on the device substrate (region 14a). The channel-accommodating region 15 may be implanted and/or diffused into this epitaxial layer or may be a second epitaxial layer deposited thereon. The drain connection 41 in the drain trench 40 extends through the thickness of both the channel-accommodating region 15 and the drain drift region 14b to reach the more highly doped drain electrode region 14a. The drain trench insulator 24 on the side-walls of the drain trench 40 may be, for example 100 nm thick for a 50 volt device.

FIG. 4 shows the gate trench 20 extending to the same depth as the drain trench 40. In this situation for a higher voltage device, it is advantageous to increase the thickness of the gate dielectric 22 adjacent to the highly doped drain electrode region 14a. FIG. 4 illustrates a thicker dielectric 22a at the bottom of the trench 20 and at the lower part of the side-walls adjacent to the drift region 14b. This thicker dielectric 22a may be, for example, of the same thickness and composition as the drain insulator 24.

In a modification of the FIG. 4 device, a shallower gate trench 20 may be adopted, with its bottom in the drift region 14b. Both trenches 20 and 40 may be etched initially to the shallower depth, after which the gate trench 20 can be masked while continuing to etch the drain trench 40 to reach the region 14a.

Figure 5:
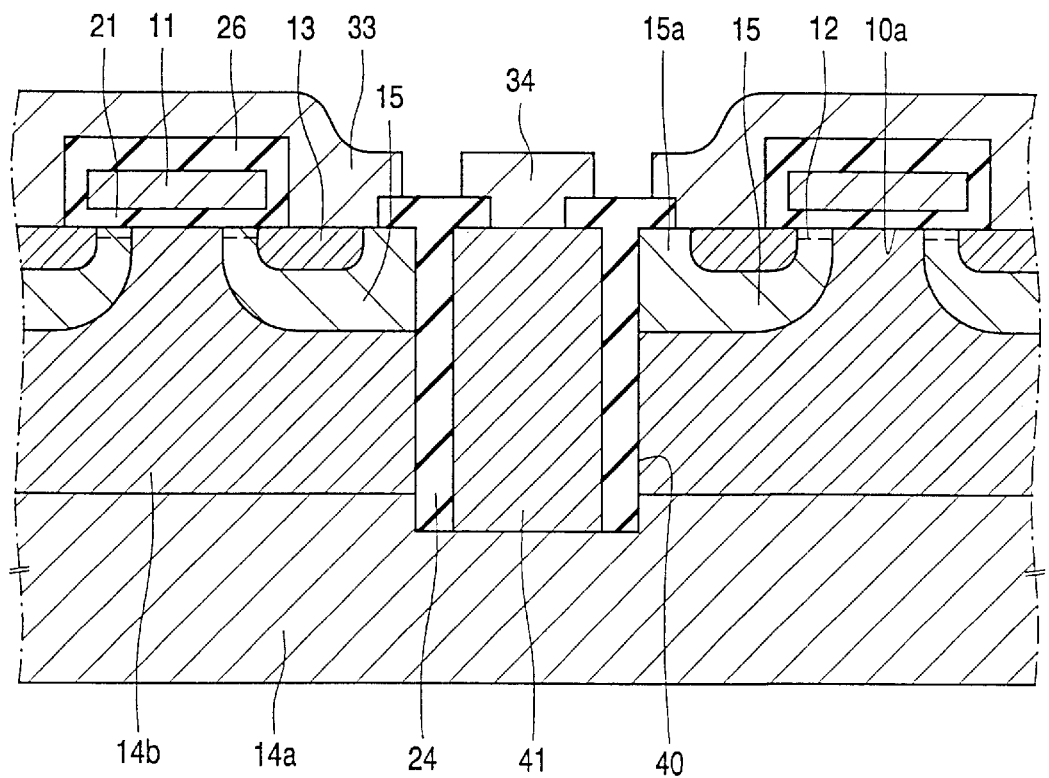
FIG. 5 is a cross-sectional view of an active central part of a further field-effect semiconductor device in accordance with the invention, having a planar-gate.

The present invention is particularly advantageous for fabricating compact device layouts with a trench-gate configuration. However, a trenched drain connection 41 in accordance with the present invention may be incorporated in planar-gate devices. A specific example is illustrated in FIG. 5. In this device, the gate electrode 11 is present on a gate dielectric layer 21 on the body surface 10a. Through a planar channel-accommodating region 15, the drain drift region 14b extends to the surface 10 below the gate electrode 11. The conduction channel 12 is formed in the intermediate part of the channel-accommodating region 15 below the gate electrode 11, between the drift region 14b and the source region 13.

In the FIG. 5 device, the drain trench 40 extends through the thickness of the channel-accommodating region 15 to the underlying drain region 14a. Although the channel-accommodating region 15 extends laterally to the drain trench 40, it is separated from the drain connection 41 by the intermediate insulating layer 24 on the side-walls of the drain trench 40. It will be appreciated that this layout is less compact and less advantageous to manufacture than the trench-gate embodiments.

A discrete device has been illustrated with reference to FIGS. 1 to 5, having its drain region 14a extending as a substrate to the back surface 10b of the body 10. However, an integrated device is also possible in accordance with the invention. In this case, the region 14a or 14 may be a doped buried layer between a device substrate and an epitaxial low-doped region 14b or 15. This buried layer region 14a or 14 may be contacted by the trenched drain connection 41 that is separated from the channel-accommodating region 15 by the insulating layer 24 at the side-walls of the trench 40.

Usually the gate electrode 11 is formed of doped polycrystalline silicon as described above. However, other known gate technologies may be used. Thus, for example, additional materials may be used for the gate electrode 11, such as a thin metal layer that forms a silicide with the polycrystalline silicon material. Alternatively, the whole gate electrode 11 may be of a metal instead of polycrystalline silicon. The same materials may be adopted for the drain connection 41.

FIGS. 1 to 4 illustrate the preferred situation of an insulated trench-gate structure, in which a dielectric layer 22 lines the gate trench 20. However, so-called Schottky gate technologies may alternatively be used. In this case, a gate dielectric layer 22 is absent and the trench-gate electrode 11 is of a metal that forms a Schottky barrier with the low-doped channel-accommodating region 15. The Schottky gate electrode 11 is capacitively coupled to the channel-accommodating region 15 by the depletion layer present at the Schottky barrier.

The particular examples described above are n-channel devices, in which the regions 13 and 14 are of n-type conductivity, the region 15 is of p-type, and an electron inversion channel 12 is induced in the region 15 by the gate electrode 11. By using opposite conductivity type dopants, a p-channel device in accordance with the invention can be constructed. In this case, the regions 13 and 14 are of p-type conductivity, the region 15 is of n-type, and a hole inversion channel 12 is induced in the region 15 by the gate electrode 11.

From reading the present disclosure, other variations and modifications will be apparent to persons skilled in the art. Such variations and modifications may involve equivalent and other features which are already known in the design, manufacture and use of semiconductor devices, and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

The Applicants hereby give notice that new claims may be formulated to any such features and/or combinations of such features during the prosecution of the present Application or of any further Application derived therefrom.

What is claimed is:

1. A field-effect semiconductor device comprising a semiconductor body having a plurality of side-by-side device cells at one major surface of the body, wherein each device cell has a source region that is separated by a channel-accommodating region of a first conductivity type from an underlying drain region of an opposite, second conductivity type, a gate electrode is capacitively coupled to the channel-accommodating region to control a conduction channel between the source and drain regions, and the device has at least one drain connection that extends in a drain trench from the one major surface to the underlying drain region, characterized in that the channel-accommodating region extends laterally to the drain trench, the drain trench extends through the thickness of the channel-accommodating region to the underlying drain region, the drain connection is separated from the channel-accommodating region by an intermediate insulating layer on side-walls of the drain trench, and wherein the drain region comprises a more highly doped electrode region underlying a less highly doped drift region, and the drain connection in the drain trench extends through the thickness of both the channel-accommodating region and the drain drift region to reach the more highly doped drain ode region.

2. A device as claimed in claim 1 further characterised in that the drain trench extends through a cell comprising a source region that is laterally separated from the drain trench by an intermediate part of the channel-accommodating region, which intermediate part of the channel-accommodating region is outside the control of the gate electrode.

3. A device as claimed in claim 1 further characterised in that the gate electrode extends in a gate trench through the thickness of the channel-accommodating region, and the source region of each cell is adjacent to the gate trench at the one major surface.

4. A device as claimed in claim 3, further characterised in that the gate trench is lined with a gate dielectric layer that is thinner than the intermediate insulating layer on the side walls of the drain trench.

5. A device as claimed in claim 1, further characterized in that the drain drift region has a dopant concentration of the second conductivity type that is less than a conductivity-type-determining dopant concentration of the first conductivity type of the channel-accommodating region.

6. A device as claimed in claim 1 further characterised in that the drain region comprises a monocrystalline substrate of the second conductivity type, and the channel-accommodating region is present in an epitaxial layer on the monocrystalline substrate.

7. A field-effect semiconductor device comprising a semiconductor body having a plurality of side-by-side device cells at one major surface of the body, wherein each device cell has a source region that is separated by a channel-accommodating region of a first conductivity type from an underlying drain region of an opposite, second conductivity type, a gate electrode is capacitively coupled to the channel-accommodating region to control a conduction channel between the source and drain regions, and the device has at least one drain connection that extends in a drain trench from the one major surface to the underlying drain region, characterized in that the channel-accommodating region extends laterally to the drain trench, the drain trench extends through the thickness of the channel-accommodating region to the underlying drain region, the drain connection is separated from the channel-accommodating region by an intermediate insulating layer on side-walls of the drain trench, and the drain trench extends through a connection cell that is laterally surrounded by device cells without a drain trench.

8. The device as claimed in claim 7, further characterized in that, each device cell comprises a source region which is laterally separated from the drain trench by an intermediate part of the channel-accommodating region that is outside the control of the gate electrode.

* * * * *